United States Patent

Rao et al.

[11] Patent Number: 5,537,353
[45] Date of Patent: Jul. 16, 1996

[54] LOW PIN COUNT-WIDE MEMORY DEVICES AND SYSTEMS AND METHODS USING THE SAME

[75] Inventors: G. R. Mohan Rao, Dallas; Ronald T. Taylor, Grapevine; Sudhir Sharma, Plano, all of Tex.

[73] Assignee: Cirrus Logic, Inc., Fremont, Calif.

[21] Appl. No.: 521,867

[22] Filed: Aug. 31, 1995

[51] Int. Cl.$^6$ .................................. G11C 7/00; G11C 8/00
[52] U.S. Cl. ............... 365/189.02; 365/221; 365/230.02; 365/230.08; 365/233
[58] Field of Search ............................. 365/189.02, 221, 365/230.02, 230.08, 233; 395/162, 164

[56] References Cited

U.S. PATENT DOCUMENTS

| | | | |
|---|---|---|---|
| 4,435,792 | 3/1984 | Bechtolsheim | 365/230.02 |
| 4,660,181 | 4/1987 | Saito et al. | 365/230.02 |
| 4,958,322 | 9/1990 | Kosugi et al. | 365/189.02 |
| 5,109,360 | 4/1992 | Inazumi et al. | 365/230.02 |
| 5,249,160 | 9/1993 | Wu et al. | 365/230.02 |
| 5,319,755 | 6/1994 | Farmwald et al. | 395/325 |
| 5,408,129 | 4/1995 | Farmwald et al. | 257/692 |
| 5,430,676 | 7/1995 | Ware et al. | 365/189.02 |
| 5,434,817 | 7/1995 | Ware et al. | 365/189.01 |
| 5,450,542 | 9/1995 | Lehman et al. | 395/164 |

*Primary Examiner*—David C. Nelms
*Assistant Examiner*—Trong Phan
*Attorney, Agent, or Firm*—Winstead, Sechrest & Minick

[57] ABSTRACT

A memory device 200 which includes a multiplexed address/data input/output 230. Circuitry 200 is based around an array 201 of memory cells and includes circuitry 202, 204 for addressing at least one of the cells in the array in response to at least one address bit and circuitry 208, 210, 211, 212 for exchanging data with an addressed one of the cells. Memory device 200 also includes control circuitry 206 operable to pass an address bit presented at the multiplexed input/output to the circuitry for addressing during a first time period and allow for the exchange of data between the circuitry for exchanging and multiplexed input/output during a second time period.

29 Claims, 3 Drawing Sheets

(PRIOR ART)

LOW PIN COUNT-WIDE MEMORY DEVICES AND SYSTEMS AND METHODS USING THE SAME

TECHNICAL FIELD OF THE INVENTION

The present invention relates in general relates in general to electronic circuits and devices and in particular to low pin count memory devices and systems and methods using the same.

BACKGROUND OF THE INVENTION

Presently, most memory systems in computers are either constructed from static random access memory devices (SRAMs) or dynamic random access memory devices (DRAMs). Each type of memory device has advantages and disadvantages, and as a result DRAMs and SRAMS are typically restricted to different applications. SRAMs are faster and are typically used in applications where fast access times and high bandwidth are critical, such as in cache memories. SRAMs however consume more power, are more expensive to fabricate, and provide fewer cells (bits) per given chip space. On the other hand, while slower than SRAMs, DRAMs are typically less expensive, consume substantially less power, and provide more bits in the same chip space (i.e. have a higher cell density). DRAMs are typically used to construct those memory subsystems, such as system memories and display frame buffers, where power reduction and cell density are more critical than speed. In most computing systems, it is these subsystems which dominate the system architecture, and hence, DRAMs remain the prevalent type of memory device on the market.

In the vast majority of presently available commercial DRAMs, the maximum number of available data input/output pins is 16, allowing access to a maximum of 16 bits per random access (or page) cycle. This presents a problem in the construction of state of the art computing systems, where the data buses are as wide as 64 or 72 bits. For example, to support a 64-bit wide data bus, four parallel "by 16" devices are required per bank of memory. Multiple chips in turn require additional board space, increase power consumption and increase the number of required interconnections on the printed circuit boards. Further, since DRAMs (monolithic) are constructed in fixed sizes, such as 512 kbytes or 2 Mbytes. Memory space is often wasted. For example, depending on whether 512 KByte or 2 MByte devices are used, each system memory bank would have a corresponding capacity of 1 MByte or 4 MBytes respectively (in this case). If only an intermediate capacity is required per bank, such as 3 MBytes, the larger incrementation must be selected and substantial memory space is wasted.

It would be advantageous to construct DRAMs with wider data ports. For example, two DRAMs each with 32 data pins or one DRAM with 64 data pins could support a 64-bit bus during a single random access. However, increased pin count almost always increases device cost. In devices such as the CPU, where only a single unit is required per system, the increased cost associated with increased pin count can usually be tolerated. In contrast, such cost increases normally cannot be tolerated in the case of memory devices, since a significant number of memory devices are normally required per system, typically between 10 and 20 in current architectures. The problem of pin count is particularly difficult if a 64-bit wide device is considered. Here, at least 64 data pins and approximately 21 other pins for addresses, power and control signals) would be required. Currently available packages come in 60 and 100 pin counts, and therefore, in this case, the more expensive 100 pin package would have to be selected, even though a large number of pins would go unused.

Thus, the need has arisen for circuits and methods for implementing wide memory devices. In particular, such circuits and methods should be applicable to DRAM memory devices, although not necessarily limited thereto. In implementing such a wide memory device, pin count should be minimized.

SUMMARY OF THE INVENTION

The principles of the present invention provide for the design and construction of wide data port memory devices. In particular, these principles are applicable to dynamic random access memory devices (DRAMs), although they are equally adapted to other types of memory devices, such as SRAMs, where a wide data interface is required. Generally, the invention provides that one or more inputs to a memory device are multiplexed such that during one operational cycle address bits may be received and during another operational cycle data bits may be received or transferred (exchanged). By multiplexing at least some inputs in such a fashion, more data bits can be exchanged with the memory device at one time than would be otherwise possible in present day devices. Among other additional advantages, a wider address port can be provided in a conventional package without having to increase the number of (package) interconnect pins.

According to one embodiment of the invention, a memory device is provided which includes a multiplexed address/data input/output. The memory device includes an array of memory cells, circuitry for addressing at least one of the cells in the array in response to at least one address bit, and circuitry for exchanging data with an addressed one of the cells. Memory device further includes control circuitry which is operable to pass an address bit presented at the multiplexed input/output to the circuitry for addressing during a first time period and allow for the exchange of data between the circuitry for exchanging and the multiplexed input/output during a second time period.

In a second embodiment of the present invention, a memory device is provided which includes at least one dedicated address pin, at least one dedicated data pin, and at least one multiplexed address/data pin. The memory device includes an array of dynamic random access memory cells arranged in rows and columns, each row associated with a wordline and each column associated with a bitline. Addressing circuitry is included for selecting a wordline and at least one bitline to allow access to a selected storage location comprising at least one cell, in response to address bits received at the dedicated address pin and the multiplexed address/data pin. Data control circuitry is provided for controlling exchange of data between the multiplexed address/data and dedicated data pins and the array. Also provided is data input/output circuitry operable during an inactive period to couple the multiplexed pin to the addressing circuitry for passing at least one address bit presented at the multiplexed pin to the addressing circuitry. The input/output circuitry is operable during an active period to couple the multiplexed address/data pin to the data control circuitry for exchanging a data bit between the multiplexed pin and the array.

The principles of the present invention are also applicable to data processing and other PC (Personal Computer) subsystems. According to one such embodiment, a processing system is provided which includes processing circuitry for operating on data, an address bus coupled to the processing circuitry, a data bus coupled to the processing circuitry, and a memory device. The memory device includes a multiplexed address/data input, an array of memory cells, circuitry for addressing at least one of the cells in the array, circuitry for exchanging data with an addressed one of the cells, and control circuitry. The control circuitry is operable to pass an address bit presented on the multiplexed pin to the circuitry for addressing during a first time period and allow for the exchange of data between the circuitry for exchanging and the multiplexed Din during a second time period. The processing system further includes interface circuitry for selectively coupling address and data bits received from the address and data buses to the multiplexed address/data pin of the memory device.

The principles of the present invention are further embodied in methods for controlling a memory device. According to one embodiment, a method is provided for controlling a memory device, the memory device including a multiplexed address/data input/output, an array of memory of cells, address circuitry for addressing the cells in the array and data input/output circuitry for exchanging data with the addressed cell. The method includes the steps of passing at least one address bit presented on the multiplexed input/output to the address circuitry during a first time period and the step of exchanging data between the circuitry for exchanging and the multiplexed input/output during a second time period.

According to another embodiment, a method is provided for operating a DRAM including at least one dedicated address pin, at least one dedicated data pin, at least one multiplexed address/data pin, an array of dynamic random access memory cells, addressing circuitry for selecting a storage location in the array, and data control circuitry for controlling the exchange of data between the multiplexed address/data and dedicated data pins and the addressed location. During precharge, the multiplexed address/data pin is coupled to the addressing circuitry. At least one address bit presented at the multiplexed pin is passed the addressing circuitry. Then, during an active period, the multiplexed address pin is switched to the data control circuitry and a data bit is exchanged between the multiplexed pin and an addressed location within the array.

The principles of the present invention provide substantial advantages over prior art memory devices. In particular, wide data port memory devices can be constructed which will allow as few as a single device to service a wide data bus, such as a 64-bit or 72-bit data bus. Further, wide data devices can now be packaged in conventional packages and/or a wider data port can be provided to a given device in a given package. As a result, fewer devices will be required to construct a given memory system and memory use can be optimized.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1:
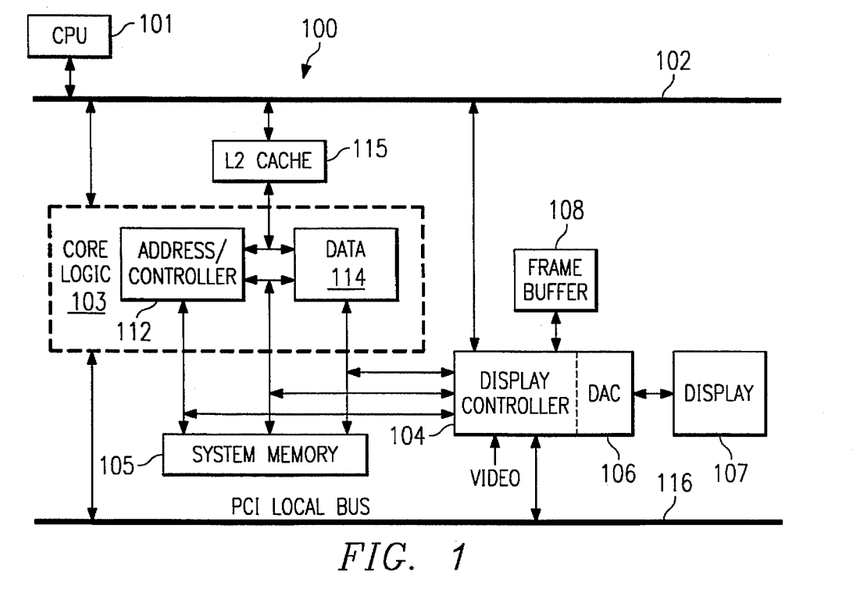
FIG. 1 is a high level functional block diagram of a typical data processing system in which memory devices embodying the principles of the present invention may be used.

FIG. 1 is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address intensive" while one or more core logic chips, such as chip 114 in FIG. 1, are "data intensive." CPU 101 can directly communicate with core logic 103 or through an external (L2) cache 115. L2 cache 115 may be for example a 256KByte fast SRAM device(s). It should be noted that CPU 101 can also include on-board (L1) cache.

Display controller 104 may be any one of a number of commercially available VGA display controllers. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y- zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select and virtual memory operations. In a pentium processor system, the address portions of CPU bus 102 and PCI bus 116 are typically on the order of 30 bits wide.

Figure 2:
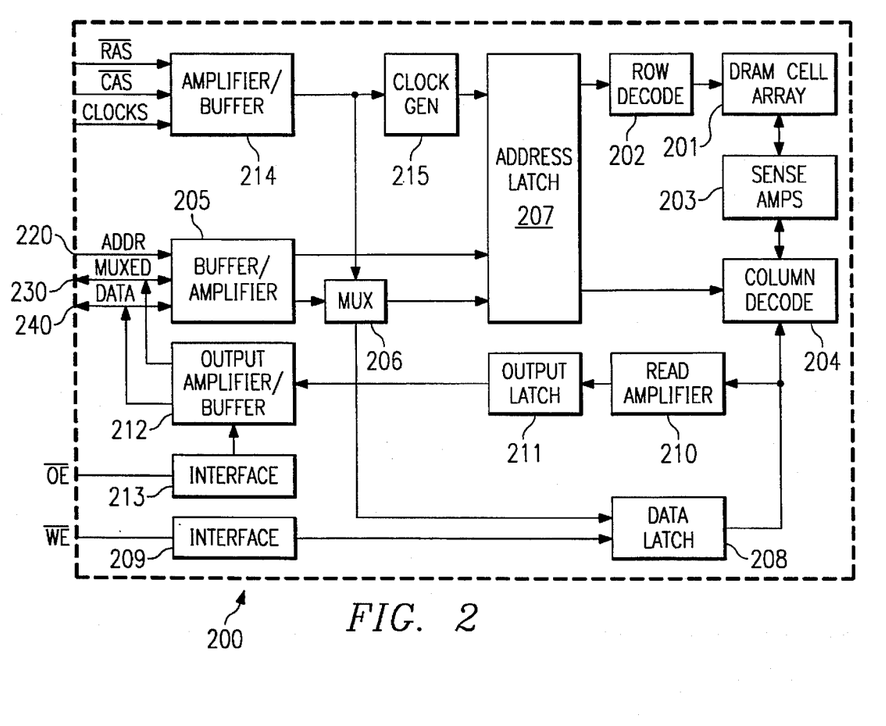
FIG. 2 is a high level functional block diagram of a memory device embodying the principles of the present invention.

FIG. 2 is a functional block diagram of a low pin count-wide memory device 200 embodying the principles of the present invention and constructed as a monolithic integrated circuit. In the preferred embodiment, device 200 is based around a DRAM cell array 201. Cell array 201 is arranged in M number of rows and N number of columns, which may be partitioned into a number of cell arrays. Each row is associated with a conductive rowline (wordline) and each column is associated with at least one conductive bitline. A row select is accomplished through a row decoder 202 which controls the voltage on each of the wordlines in the array in response to received row addresses.

Sense amplifiers 203 are coupled to the bitlines of cell array 201. Preferably, one sense amplifier is included for each of the bitlines, however, the sense amplifiers 203 may also be multiplexed between multiple bitlines in alternate embodiments. A column decoder 204 is coupled to sense amplifier 203 and controls the selection of a given number of column lines (bitlines) during an access. Typically, during an access all sense amplifiers 203 are active and column decoder only gates those which correspond to the bitlines intersecting the cells of the selected location.

In the illustrated embodiment, memory 200 is organized as a "by 64" memory in which column decoder 204 selects 64 bitlines to allow simultaneous access to 64 bits along a selected row (i.e., a 64-bit location) during a random access. In alternate embodiments, memory 200 could be organized as a by 1, by 2, by 4, by 8, by 32 or larger location memory (e.g., by 72-bit). A by 64-bit architecture advantageously allows memory 200 to entirely interface with the buses in a 64-bit system 100.

According to the principles of the present invention, memory 200 includes a selected number of I/O pins 220 which are dedicated for receiving addresses, a second selected number of pins 230 which are multiplexed for either inputting addresses or inputting and outputting data, and a third selected number of pins 240 dedicated for inputting and outputting data. The process of inputting and outputting data and addresses will be further discussed below. However, it should be noted at this point than addresses and data are selectively presented to the multiplexed pins 230 under control of core (glue) logic; conventional core logic 103 of system 100. Generally, conventional core logic chips can bridge the address and data bus and switch a given port in the system, such as multiplexed pins 230, to either the address path or the data path of either CPU bus 102 or PCI local bus 116.

It should be noted that the "frame buffer" can also use the address/data mixing scheme, provided the memory controller embedded in the graphics controller is designed suitably.

It should be noted that while in the illustrated embodiment only some of the address pins are multiplexed, and some are dedicated, in alternative embodiments all the pins receiving addresses may be multiplexed to also receive data. The same is true for those pins receiving data; in alternate embodiments all pins exchanging data may be multiplexed to also receive addresses. In the preferred embodiment, some address pins are dedicated in order to be available to be used for other functions. For example, the pins receiving the high order address bits may be non-multiplexed and also used for bank or byte select operations.

I/O pins 220, 230, 240 are coupled to an input buffer/amplifier 205. Addresses received on a dedicated address pins 220 are coupled to an address latch 207. Addresses received on multiplexed pins 230 are selectively passed to address latch 207 through a multiplexer 206. It should be noted that row and column addresses received at pins 220 and 230 may be word serially received (i.e., row address bits received as a word and column address bits received subsequently as a separate word) from a conventional multiplexed address bus. In this case, address latch may be a conventional 3-phased address latch system which would pipeline the initially received row addresses to row decoder 202 and the subsequently received column addresses to column decoder 204.

During data input (a write operation), data received on multiplexed pins 230 and dedicated data pins 240 are switched by multiplexer 206, in accordance with the timing discussed below, to a data latch 208. During a write, data latch 208 transfers the data being written to column decoder 204 in response to a write enable (WE) control signal received by TTL, CMOS or other I/O standard, interface circuit 209.

During a data read, data output from sense amplifiers 203 and column decoder 204 are passed first to a read amplifier 210 and then to an output latch 211. The data from output latch 211 is then passed through an output amplifier/buffer 212 to multiplexed pins 230 and data pins 240, preferably bypassing input buffer/amplifier 205. Output amplifier/buffer 212 is enabled by an output enable signal (OE) received by TTL, CMOS or other I/O standard, interface circuitry 213.

The timing and control in the illustrated embodiment of FIG. 2 is based on a row address strobe (RAS), column address strobe (CAS) and conventional DRAM control clocks received through an amplifier/buffer 214. In the preferred asynchronous embodiment, RAS is used to control (switch) multiplexer 206 as discussed below. Alternatively, a multiplexer 206 may be controlled by both the RAS and CAS signals. A clock generator 215 generates the clocks necessary to pipeline addresses through address latch 207 from the received RAS, CAS and clock signals.

Figure 3:
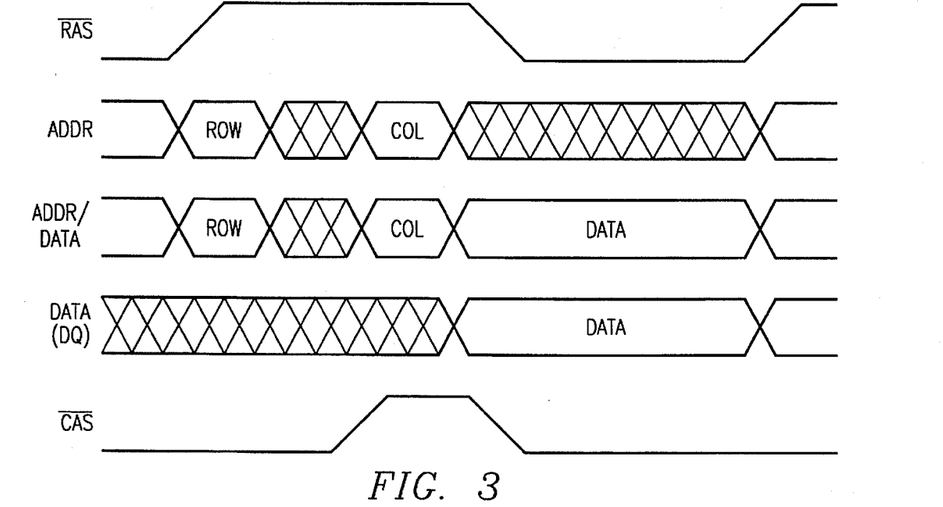
FIG. 3 is a timing diagram depicting one access cycle during a new and nontraditional method of operating the memory device of FIG. 2.

FIG. 3 is a timing diagram illustrating the preferred operation of memory 200 according to the principles of the present invention. During the period when RAS is high, memory 200 is in precharge, as is known in the art. Generally, during precharge, various nodes of the dynamic circuitry, of which memory device 200 is preferably constructed, are brought to selected voltages, and most importantly, the sense amplifiers are equalized. According to the present invention, addresses are also received during this period when RAS is inactive (high) on both the address dedicated pins 220 and the multiplexed address/data pins 230. Consequently, during RAS high, MUX 206 switches to couple multiplexed pins 230 to address latch 207. In the preferred embodiment, row address bits are first received and passed to address latch 207 for pipelining to row decoder 202. After a don't care period, the column address bits presented on pins 230 and 240 are received and pipelined through address latch 207 to column decoder 204. In a non-multiplexed addressing system, row and column bits would be received at once.

On the falling edge of RAS, memory 200 enters an active cycle. Among other things, the sense amplifiers are now prepared to transfer data and all dynamic circuitry which had been shut-down during the inactive cycle to save power are re-activated. During a write to cell array 201, multiplexer 206 switches such that data received at both the multiplexed input pins 230 and the data dedicated pins 205 are coupled to data latch 208 for presentation to column decoder 204, as controlled by the write enable signal. During a read, multiplexer 206 is in a don't care or tri-state (high impedance) condition. The data is then read out through the path comprising sense amps 203, column decoder 204, read amplifier 210, output latch 211 and output amplifier/buffer 212. With the rising edge of RAS, memory 200 leaves the active state, enters the next inactive cycle and waits for a new set of row and column addresses.

In the preferred embodiment, the input of row and column addresses, even from a multiplexed bus, is performed independent of a column address strobe (CAS). In alternative embodiments, CAS may be used to control the timing and latching in to address latch 207 of the column addresses appearing on address pins 220 and multiplexed pins 230 during each inactive cycle. The timing relationship of CAS with the RAS, addresses and data is also shown in FIG. 3.

The scheme also works equally well, as an alternate embodiment, in a synchronous mode with master clock or in a traditional DRAM timing scheme wherein the row address is strobed on the falling edge as RAS and the column address is strobed on the falling edge of CAS.

Figure 4:
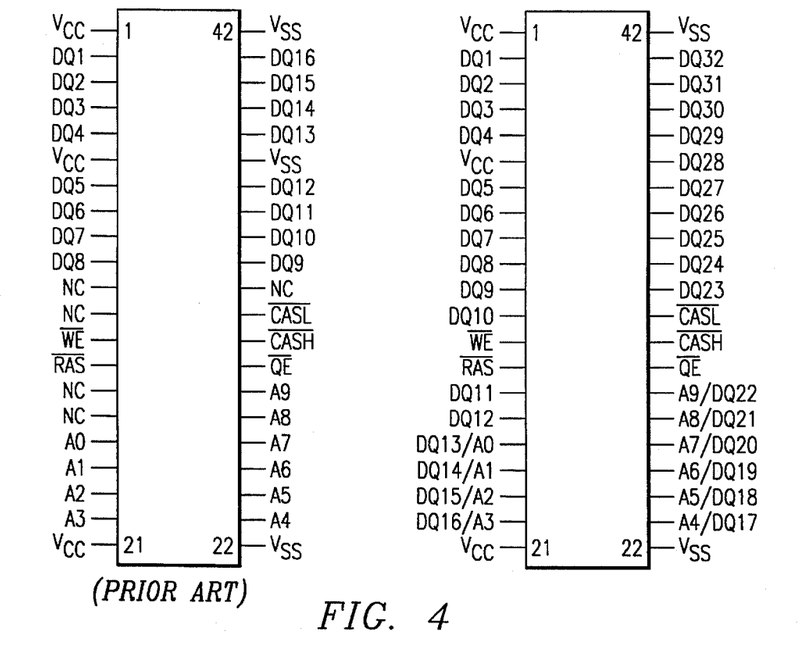
FIG. 4 is a top plan view diagram providing a side-by-side comparison of an example conventional packaged DRAM with a DRAM embodying the principles of the present invention in the same package.

FIG. 4 is a enlarged plan view of a conventional DRAM in a 42 pin SOJ package side-by-side with a DRAM embodying the present invention, also packaged in a 42 pin SOJ package. Pins labeled Ax are dedicated address pins, pins labeled DQx are dedicated data pins, and pins bearing the label Ax/DQx are multiplexed pins such as described above. Pins bearing NC are "no connect" while RAS, CASL, CASH, OE, WE, $V_{CC}$ and $V_{SS}$ are all conventional control signals and clocks known in the art. As can be seen from FIG. 4, with the conventional DRAM, the widest data pore that can reasonably be packaged in a 42 pin SOJ package is 16 bits wide. In contrast, a 32-bit wide device according to the present invention can be packaged in and operate from a 42-pin SOJ package. Advantageously, the RAS, CASL, CASH, OE, WE, $V_{CC}$ and $V_{SS}$ pins for both packages are identically situated, providing compatibility with the same associated printed circuit board receptacles. It should be noted that CASL and CASH in the 32-bit wide embodiment allow for the selection of 2 bytes from each 32-bit word.

Figure 5:
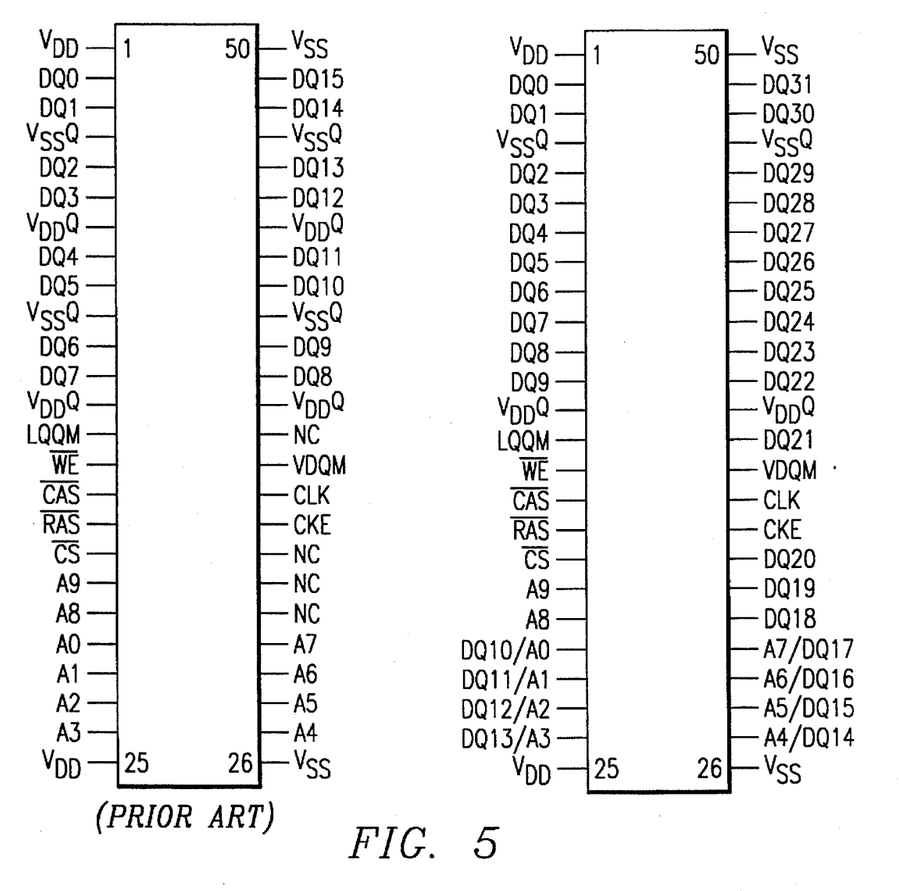
FIG. 5 is a top plan view diagram providing a side-by-side comparison of a packaged conventional SDRAM (synchronous) with an SDRAM embodying the principles of the present invention in the same package.

It should be recognized that the principles of the present invention may also be applied to page mode DRAMs and synchronous DRAMs (SDRAM). In the SDRAM embodiment, addresses and data are clocked in and pipelined to and from the cell array in response to a master clock generated off-chip in the system. In a synchronous DRAM, RAS and CAS may still be used, in this case synchronized with the master clock. A comparison between the pin-outs of a currently available SDRAM (synchronous DRAM) in a 50-pin TSOP-II package is compared with an SDRAM embodying the present invention. The conventional SDRAM is a 2 Mbit device arranged in 65,536 word×16-bits×2 bank architecture, with a total of only 16 pins available for data input/output. According to the present invention, 2 Mbits can be provided in the same package as 32,768 words×32-bits×2 banks, with 32 pins available for data input/output.

In a page mode operation, multiple column addresses in the same row are generated internally (or presented externally) from a single received column address. This allows multiple locations to be accessed along a selected row per each column address. In contrast, in the random access discussed above, only a single location (a column, or group of columns predefined) is accessed per RAS/CAS cycle. It should also be noted that multiplexer 206 and input buffer/amplifier 205 may be combined into a single transceiver circuit.

Although the present invention and its advantages have been described in detail, it should be understood that various changes, substitutions and alterations can be made herein without departing from the spirit and scope of the invention as defined by the appended claims.

What is claimed is:

1. A memory device comprising:

a multiplexed address/data input/output;

an array of memory cells;

circuitry for addressing at least one of said cells of said array in response to at least one address bin;

circuitry for exchanging data with an addressed one of said cells;

control circuitry operable to:

pass an address bit presented at said multiplexed address/data input/output to said circuitry for addressing during a first time period; and allow for the exchange of data between said circuitry for exchanging and said multiplexed address/data input/output during a second time period.

2. The memory device of claim 1 wherein said first period is defined by a logic high period of a row address strobe received by said memory device and said second period is defined by a logic low period of said row address strobe.

3. The memory device of claim 1 wherein:

said circuitry for addressing comprises a row decoder coupled to said array, and a column decoder;

said circuitry for exchanging data comprises a plurality of sense amplifiers coupling said column decoder with said array; and said control circuitry comprises multiplexing circuitry operable to selectively couple said multiplexed address/data input/output to address inputs of said row and column decoders during said first period and couple said multiplexed address/data input/output to a data port of said column decoder during said second period.

4. The memory device of claim 1 wherein said at least one multiplexed address/data input/output receives a row address bit and a column address in serial from a multiplexed address bus during said first period.

5. The memory device of claim 3 wherein said circuitry for exchanging data with said selected cell in said array comprises:

a write path including a data latch having an input coupled to said multiplexed address/data input/output and an output coupled to said data port of said column decoder; and a read path including a read amplifier coupled to said data port of said column decoder, an output latch coupled to said read amplifier and an output buffer coupling said output latch with said multiplexed address/data input/output.

6. The memory device of claim 3 wherein said circuitry for exchanging comprises:

a first path for coupling said multiplexed address/data input/output with said data port of said column decoder during a write operation; and a second path for coupling said at least one multiplexed address/data input/output with said data port of said column decoder during a read operation.

7. The memory device of claim 1 wherein said memory device is in precharge during said first time period.

8. The memory of claim 1 wherein said memory device comprises a synchronous DRAM device and said at lease one address bit and data are presented to said at least one multiplexed address/data input/output synchronized with a clock.

9. A memory device:

at least one dedicated address pin;

at least one dedicated data pin;

at lease one multiplexed address/data pin;

an array of dynamic random access memory cells arranged in rows and columns, each said row associated with a wordline and each said column associated with a bitline;

addressing circuitry for selecting a wordline and at least one said bitline to allow access to a selected storage location comprising at least one said cell in response to address bits received at said dedicated address pin and said multiplexed address/data pin;

data control circuitry for controlling exchange of data between said multiplexed address/data and dedicated data pins and said array; and data input/output circuitry operable to:

during an inactive period couple said multiplexed address/data pin to said addressing circuitry for passing at least one address bit presented at said multiplexed address/data pin to said addressing circuitry; and during an active period couple said multiplexed address/data pin to said data control circuitry for exchanging a data bit between said multiplexed address/data pin and said array.

10. The memory device of claim 9 wherein said input control circuitry is further operable to couple said dedicated data pin with said data control circuitry during said active period for exchanging a data bit between said dedicated data pin and said array.

11. The memory device of claim 10 wherein said data control circuitry comprises:

a plurality of sense amplifiers coupled to said bitlines of said array;

a column decoder coupled to said sense amplifiers;

a write data path comprising an input buffer coupled to said multiplexed address/data pin and said dedicated data pin, a data latch, and a multiplexer for coupling said multiplexed address/data pin and said data pin to said data latch during said active period, said data latch coupling data to said column decoder in response to a received write enable signal; and a read data path comprising a read amplifier coupled to said column decoder, an output latch coupled to said read amplifier and an output buffer coupled to said output latch, said buffer coupling said output latch with said dedicated data and multiplexed address/data pins in response to an output enable signals.

12. The memory device of claim 11 wherein said multiplexer couples said multiplexed address/data pins and said data pin with said data latch in response to a logic low period of a received row address strobe defining said active period.

13. The memory device of claim 9 wherein said inactive period corresponds to a logic high cycle of a received row address strobe and said active period corresponds to a logic low cycle of said row address strobe.

14. The memory device of claim 9 wherein said at least one dedicated address pin receives a high order address bit.

15. A processing system comprising:

processing circuitry for operating on data;

an address bus coupled to said processing circuitry;

a data bus coupled to said processing circuitry;

a memory device comprising:

a multiplexed address/data input;

an array of memory cells;

circuitry for addressing at least one of said cells of said array in response to at least one address bit;

circuitry for exchanging data with an addressed one of said cells;

control circuitry operable to:

pass an address bit presented on said multiplexed address/data input to said circuitry for addressing during a first time period; and allow for the exchange of data between said circuitry for exchanging and said multiplexed address/data input during a second time period; and interface circuitry for selectively coupling address and data bits received from said address and data buses to said multiplexed address/data input of said memory device.

16. The system of claim 15 wherein said processing circuitry comprises a general purpose microprocessor.

17. The system of claim 15 wherein said processing circuitry comprises a display controller.

18. The system of claim 15 wherein said array of memory cells comprises an array of dynamic random access memory cells.

19. The system of claim 15 wherein said memory forms a portion of a system memory.

20. The system of claim 15 wherein said memory forms a portion of a frame buffer.

21. The system of claim 15 wherein said interface circuitry comprises core logic.

22. A method of controlling a memory device including, a multiplexed address/data input/output, an array of memory cells, address circuitry for addressing the cells in the array and data input/output circuitry for exchanging data with an addressed cell, the method comprising the steps of:

passing at least one address bit presented on the multiplexed address/data input/output to the address circuitry during a first time period; and exchanging data between said circuitry for exchanging and said multiplexed address/data input/output during a second time period.

23. The method of claim 22 wherein said step of passing comprises the step of passing at least one address bit during a precharge cycle.

24. The method of claim 23 wherein precharge cycle corresponds to a logic high period of a received row address strobe.

25. The method of claim 24 wherein said step of passing comprises the step of passing at least one row address bit received from a multiplexed address bus and passing in serial therewith at least one column address bit from the multiplexed address bus.

26. A method of operating a DRAM including at least one dedicated address pin, at least one dedicated data pin, at least one multiplexed address/data pin, an array of dynamic random access memory cells, addressing circuitry for accessing a selected storage location of at least one cell in the array in response to address bits received at the dedicated address pin and the multiplexed address/data pin and data control circuitry for controlling exchange of data between the multiplexed address/data and dedicated data pin and the selected location, the method comprising the steps of:

during precharge, coupling the multiplexed address/data pin to the addressing circuitry;

passing at least one address bit presented at the multiplexed address/data pin to the addressing circuitry;

during an active period, coupling the multiplexed address/data pin to the data control circuitry; and exchanging a data bit between said multiplexed address/data pin and said array.

27. The method of claim 26 wherein said step of a passing at least one address bit comprises the step of passing a row address bit and a column address bit in serial.

28. The method of claim 26 wherein said step of exchanging comprises the step of writing data presented to said multiplexed address/data pin to the memory array.

29. The method of claim 26 wherein said step of exchanging comprises the step of reading data from the memory array through the multiplexed address/data pin.

* * * * *

UNITED STATES PATENT AND TRADEMARK OFFICE
CERTIFICATE OF CORRECTION

PATENT NO. : 5,537,353

DATED : Jul. 16, 1996

INVENTOR(S) : G.R. Mohan Rao, Dallas; Ronald T. Taylor, Grapevine; Sudhir Sharma, Plano, all of Tex.

It is certified that error appears in the above-identified patent and that said Letters Patent is hereby corrected as shown below:

Col. 8, Line 61, after "at least one address", delete "bin", and insert --bit--.

Signed and Sealed this

Eighteenth Day of February, 1997

Attest:

BRUCE LEHMAN

*Attesting Officer*   *Commissioner of Patents and Trademarks*